United States Patent [19]

Su et al.

[11] Patent Number: 5,691,234
[45] Date of Patent: Nov. 25, 1997

[54] BURIED CONTACT METHOD TO RELEASE PLASMA-INDUCED CHARGING DAMAGE ON DEVICE

[75] Inventors: Kuan-Cheng Su, Taipei; Shing-Ren Sheu, Tao-Yuan, both of Taiwan

[73] Assignee: United Microelectronics Corporation, Hsin-Chu, Taiwan

[21] Appl. No.: 511,065

[22] Filed: Aug. 3, 1995

[51] Int. Cl.⁶ .................................................. H01L 21/28
[52] U.S. Cl. ......................... 437/186; 437/195; 156/643.1
[58] Field of Search .................................. 437/26, 47, 60, 437/186, 195; 156/643.1

[56] References Cited

U.S. PATENT DOCUMENTS 5,350,710  9/1994  Hong et al. .............................. 437/170
5,393,701  2/1995  Ko et al. ................................... 437/195

OTHER PUBLICATIONS

S. Wolf, "Silicon Processing for the VLSI Era, vol. 2,", Lattice Press, 1990, pp. 160–162.

Shone et al, "Gate Oxide Charging and Its Elimination for Metal Capacitor and Transistor in VLSI CMOS Double Layer Metal Technology", Pubin Symposium on Symposium on VLSI Technology pp. 73–74 in Jun., 1988.

Primary Examiner—John Niebling
Assistant Examiner—Thomas G. Bilodeau
Attorney, Agent, or Firm—William H. Wright

[57] ABSTRACT

A method for eliminating plasma-induced charging damage during manufacture of an integrated circuit is described. A semiconductor substrate having a first conductivity type is provided. An oxide layer is formed on the semiconductor substrate. An opening is formed in the oxide layer. A polysilicon layer is formed over the oxide layer and in the opening. A diffusion region is formed in the semiconductor substrate, connected to the polysilicon layer through the opening, having a second conductivity type opposite to the first conductivity type, whereby a buried contact is formed. The buried contact is connected, through the substrate, to a ground reference. Further processing in a plasma environment is performed that would normally produce charging damage to the integrated circuit, but whereby the buried contact prevents the charging damage.

21 Claims, 3 Drawing Sheets

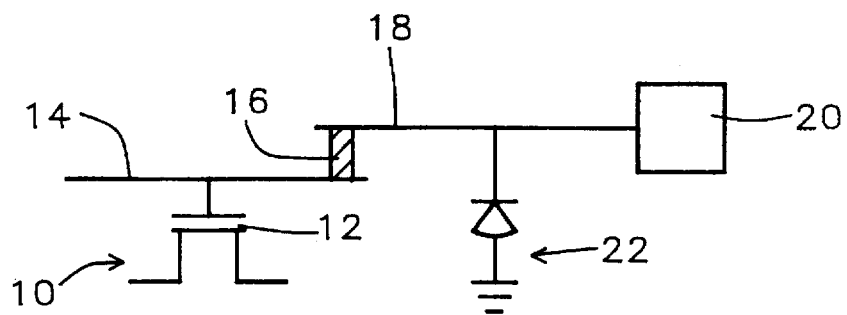
FIG. 1 — Prior Art
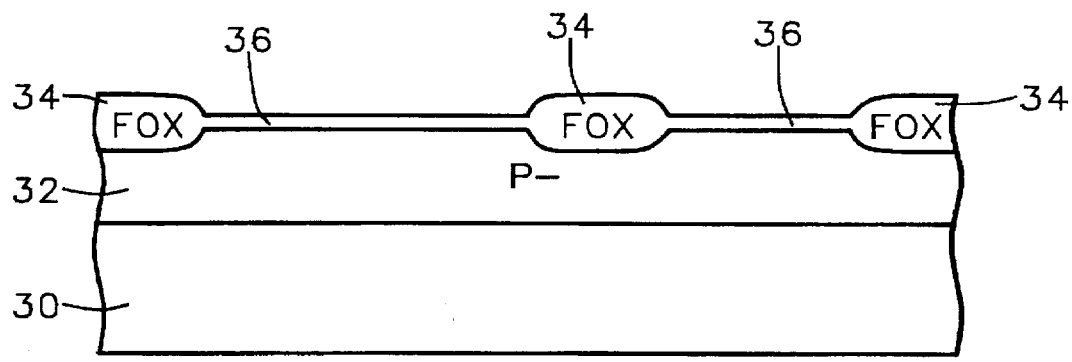
FIG. 2
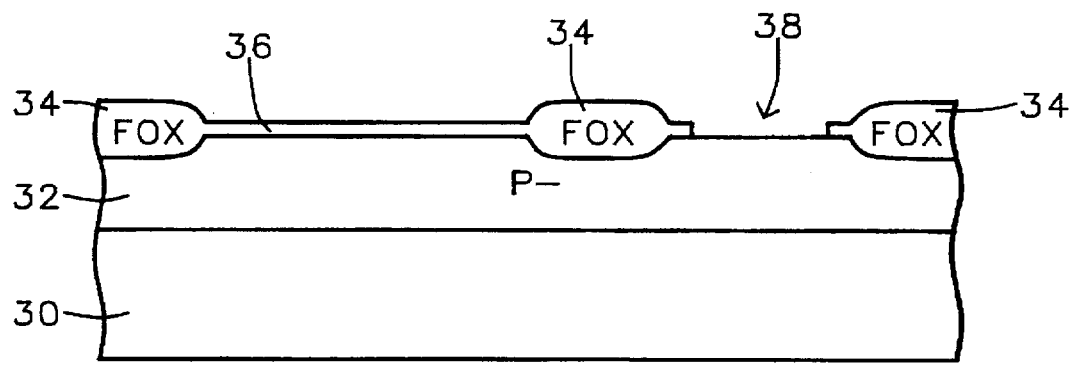
FIG. 3

BURIED CONTACT METHOD TO RELEASE PLASMA-INDUCED CHARGING DAMAGE ON DEVICE

BACKGROUND OF THE INVENTION

(1) Field of the Invention

The invention relates to the manufacture of highly dense integrated circuits, and more particularly to the reduction of electrostatic charge buildup at a Metal Oxide Semiconductor (MOS) device during manufacturing processes.

(2) Description of the Related Art

In the manufacture of highly dense integrated circuits using MOS technology, unwanted electrical charges may build up at the device gate oxide during plasma processing. The charge accumulates on floating polysilicon and metal layers electrically connected to the gate oxide. Conductive surfaces act as "antennas", amplifying this charging effect and leading to trapped charges at the gate oxide. These trapped charges can cause yield loss and reliability failures.

Workers in the field have verified this problem experimentally. Shone et al in "Gate Oxide Charging and Its Elimination for Metal Antenna Capacitor and Transistor in VLSI CMOS Double Layer Metal Technology" (published in "Symposium on VLSI Technology, pp. 73–74 in June, 1988) verified the antenna effect experimentally. They found that the double metal layer technologies worsened the effect by the ratio of the antenna area to the gate oxide area. While the worst degradation of gate oxide occurred during oxynitride deposition, other plasma processing is also believed to lead to trapped charges at the gate oxide. One suggested remedy was the attachment of a substrate diode to the metal antenna.

Others have attempted to resolve these problems. In U.S. Pat. No. 5,350,710 (Hong, et al.), an antifuse device is formed between the metal antenna and the device to be protected, in order to isolate the device during plasma processing. Later in the manufacture of the circuit, a short-circuit is formed at the antifuse by applying a sufficiently high voltage across the antifuse location, to form the final connection between the metal and device.

While the above solutions satisfactorily avoid the antenna effect during plasma processing after formation of the metal layer, they do not address the problem of plasma processing prior to metal formation, for example between formation of polysilicon layer(s) and metal formation.

SUMMARY OF THE INVENTION

It is a principal object of this invention to provide a method for eliminating plasma-induced charging damage during manufacture of an integrated circuit.

This object is achieved by providing a semiconductor substrate having a first conductivity type. An oxide layer is formed on the semiconductor substrate. An opening is formed in the oxide layer. A polysilicon layer is formed over the oxide layer and in the opening. A diffusion region is formed in the semiconductor substrate, connected to the polysilicon layer through the opening, having a second conductivity type opposite to the first conductivity type, whereby a buried contact is formed. The buried contact is connected, through the substrate, to a ground reference. Further processing in a plasma environment is performed that would normally produce charging damage to the integrated circuit, but whereby the buried contact prevents the charging damage.

BRIEF DESCRIPTION OF THE DRAWINGS

FIG. 1 is a schematic diagram of a Prior Art method for reducing plasma-induced charging damage during manufacture of an integrated circuit.

FIGS. 2 to 5 are cross-sectional diagrams of the method of the present invention of forming a buried contact to reduce plasma-induced charging damage.

FIG. 5 is taken along line 5—5.

DESCRIPTION OF THE PREFERRED EMBODIMENTS

Figure 4:
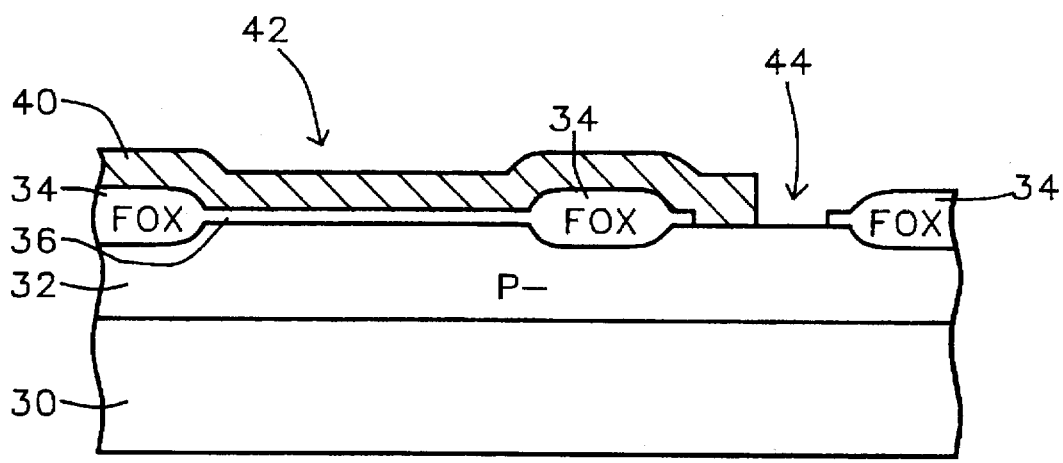

Referring now to FIG. 1, there is shown a schematic diagram to demonstrate one method from the Prior Art to address plasma-induced charging damage during fabrication of integrated circuits. After a MOS device 10 is formed having gate oxide 12 and connected to polysilicon 14, an insulating layer is formed and metal contact 16 is created. Metal interconnection line 18 is deposited and patterned and fills metal contact 16. Metal contact pad 20 may be formed at the same time. Damage to the MOS device, caused by subsequent plasma processing, is prevented due to protection diode 22 connected to the metal line 18. However, any plasma processing that takes place after formation of polysilicon 14 and before the diode is connected to metal line 18 will cause MOS damage due to charge accumulation at gate oxide 12.

It is common in the manufacture of integrated circuits today to use plasmas, with two of the most common processes being reactive plasma etching, and plasma enhanced chemical vapor deposition. A plasma is a collection of charged particles, including electrons and positive and negative ions, and it is these charged particles that collect along the conductive surfaces during plasma processing and may produce trapped charges damaging the gate oxide. The invention involves forming a buried contact connected to the polysilicon, to prevent charging damage at earlier stages of manufacture than in the Prior Art, and so to overcome the problem of the Prior Art method shown in FIG. 1.

One method of forming the buried contact structure of the invention is shown in FIGS. 2 to 6. Referring now to FIG. 2, there is shown a silicon substrate 30, with a P-well structure formed thereon by, for example, ion implanting boron at a concentration of between about 1 E 12 and 5 E 13 atoms/cm$^2$ and an energy of between about 70 and 200 KeV. Field oxide (FOX) regions 34 are formed by any of several well known processes in the art, such as LOCOS (LOCal Oxidation of Silicon), to isolate active device regions from one another. A thin gate oxide 36 is formed by thermal oxidation, to a thickness of between about 60 and 300 Angstroms.

As shown in FIG. 3, an opening 38 is formed in oxide 36 at the location of the to-be-formed buried contact, using conventional lithography and etching. Referring now to FIG. 4, a polysilicon layer is conformally deposited to a thickness of between about 500 and 6000 Angstroms. This layer is doped by, for example, in-situ doping, or by ion implantation of phosphorus at a concentration of between about 1 E 15 and 5 E 16 atoms/cm$^2$ and an energy of between about 10 and 200 KeV. The doped polysilicon is then patterned by conventional lithography and etching, to form a gate electrode for a connected MOS device in the region 42, and an opening 44 is simultaneously formed over the oxide opening.

Figure 5:
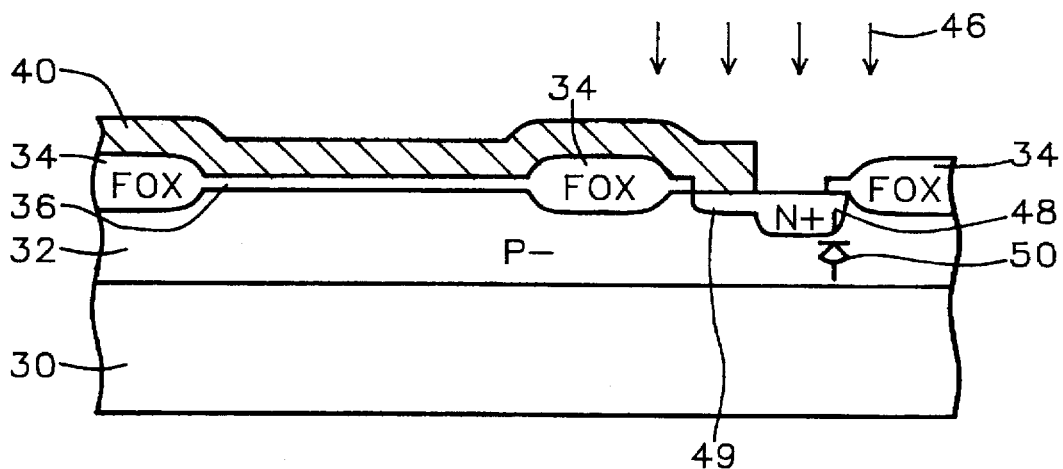

In a key step of the invention, referring now to FIG. 5, an ion implantation 46 is performed to form the buried contact of the invention. Arsenic is implanted at a concentration of between about 5 E 14 and 5 E 15 atoms/cm.$^2$ and an energy of between about 20 and 100 KeV to form N+ region 48 in the P-well 32. The active regions of MOS device 42 may be formed simultaneously with the arsenic implant.

During a subsequent drive-in of the dopant, region 49 is formed by outdiffusion from polysilicon 40, and connects to N+ region 48. The N+ region 48 is driven in by heating to a temperature of between about 800° and 850° C. for between about 10 and 30 minutes. A buried P/N contact is thus formed, as represented by diode 50, connected to polysilicon 40 and to substrate 30. By grounding the substrate, plasma processing steps that take place after formation of the FIG. 5 structure are prevented from causing charge accumulation at the gate oxide 36.

Figure 6:
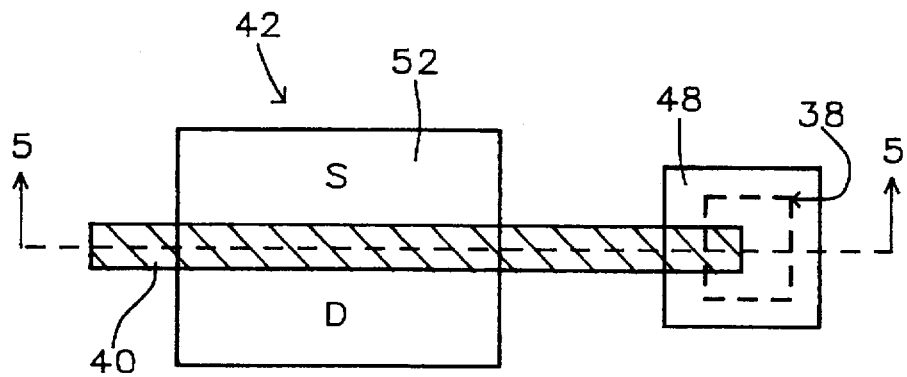
FIG. 6 is a top view of the FIG. 5 structure of the invention, where

A top view of the FIG. 5 cross-section is shown in FIG. 6, where FIG. 5 is taken along line 5—5. MOS device 42 is shown having diffusion region 52 with source S and drain D, and gate electrode 40 connected to the buried contact. The buried contact is shown having diffusion region 48 connected to poly 42 through contact 38.

Figure 7:
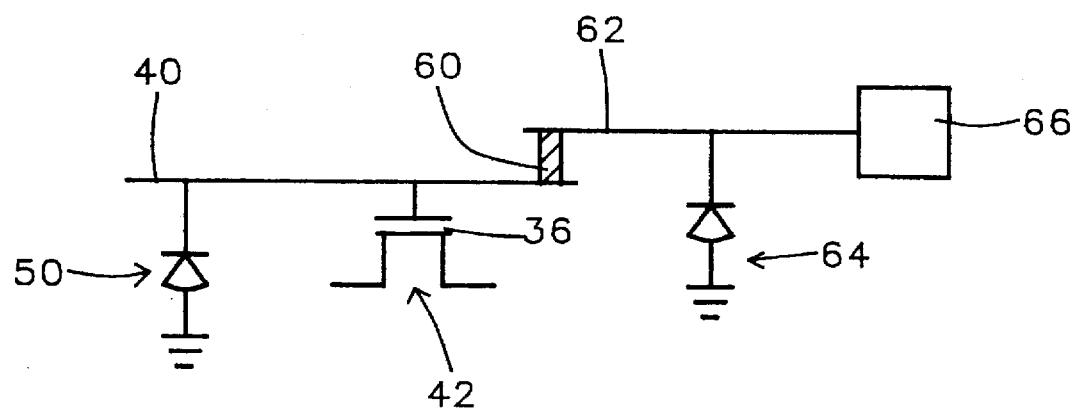
FIG. 7 is a schematic diagram of the resultant structure of the invention.

A schematic view of the invention is depicted in FIG. 7, showing buried contact 50 connected to poly 40, MOS device 42 having gate oxide 36. It can be seen that the buried contact provides protection to the gate oxide from plasma-induced charging defects before metallization. Processing would then continue to complete formation of the integrated circuit, including formation of metal contact 60, metal 62, second protection diode 64 and metal contact pad 66.

While the invention has been particularly shown and described with reference to the preferred embodiments thereof, it will be understood by those skilled in the art that various changes in form and details may be made without departing from the spirit and scope of the invention. For example, the invention could be used to connect a P+ polysilicon layer to a P+/N-well buried contact, or to a P+/N-substrate structure.

What is claimed is:

1. A method of preventing plasma-induced charging damage during manufacture of an integrated circuit, comprising the steps of:
    providing a semiconductor substrate having a first conductivity type;
    forming an oxide layer on said semiconductor substrate;
    forming a first opening in said oxide layer;
    forming a polysilicon layer over said oxide layer and in said first opening;
    patterning said polysilicon layer to form a second opening at least partially over said first opening;
    forming a diffusion region in said semiconductor substrate, connected to said polysilicon layer through said first opening, having a second conductivity type opposite to said first conductivity type, whereby a buried contact is formed;
    connecting said buried contact, through said substrate, to a ground reference; and
    further processing in a plasma environment that would normally produce charging damage to said integrated circuit, but whereby said buried contact prevents said charging damage.

2. The method of claim 1 wherein said processing in a plasma environment is plasma enhanced chemical vapor deposition.

3. The method of claim 1 wherein said processing in a plasma environment is plasma etching.

4. The method of claim 3 wherein said plasma etching is a sputter etch.

5. The method of claim 1 further comprising patterning said oxide layer and said layer of polysilicon to form a gate oxide and gate electrode for a MOS (Metal Oxide Semiconductor) transistor.

6. The method of claim 5 further comprising forming field oxide regions in said substrate to separate said MOS transistor from said buried contact.

7. The method of claim 1 wherein said forming a diffusion region is by ion implanting a dopant of said second conductivity type, through said second opening, into said substrate.

8. The method of claim 7 further comprising the step of driving in said second conductivity type dopant by heating to a temperature of between about 800° and 850° C. for between about 10 and 30 minutes.

9. A method of subjecting an integrated circuit formed on a silicon substrate, having a polysilicon layer on its surfaces which is electrically connected to device structures, to a plasma process, comprising the steps of:
    connecting said polysilicon layer to a buffed contact in said silicon substrate;
    connecting said buried contact through said substrate to a ground potential;
    placing said integrated circuit in a chamber for accomplishing said plasma process;
    subjecting said integrated circuit to said plasma processing process whereby said connection to said buried contact prevents damage to said device structures; and
    removing said integrated circuit from said chamber.

10. The method of claim 9 wherein said plasma process is plasma enhanced chemical vapor deposition.

11. The method of claim 9 wherein said plasma process is plasma etching.

12. The method of claim 11 wherein said plasma etching is a sputter etch.

13. The method of claim 9 further comprising the steps of:
    forming one or more metal layers over and connected to said polysilicon layer; and
    forming a contact pad connected to said substrate through a protective diode, the contact pad connected to said polysilicon layer through said one or more metal layers.

14. A method of manufacturing an integrated circuit to prevent plasma-induced charging damage during manufacture, comprising the steps of:
    providing a semiconductor substrate having a first conductivity type;
    forming an oxide layer on said semiconductor substrate;
    forming a first opening in said oxide layer;
    forming a polysilicon layer over said oxide layer and in said first opening;
    patterning said polysilicon layer to form a second opening at least partially over said first opening;
    forming a diffusion region in said semiconductor substrate, connected to said polysilicon layer through said first opening, having a second conductivity type opposite to said first conductivity type, whereby a buried contact is formed;
    connecting said buried contact, through said substrate, to a ground reference;

further processing in a plasma environment that would normally produce charging damage to said integrated circuit, but whereby said buried contact prevents said charging damage; and completing formation of said integrated circuit.

15. The method of claim 14 wherein said processing in a plasma environment is plasma enhanced chemical vapor deposition.

16. The method of claim 14 wherein said processing in a plasma environment is plasma etching.

17. The method of claim 16 wherein said plasma etching is a sputter etch.

18. The method of claim 14 further comprising patterning said oxide layer and said layer of polysilicon to form a gate oxide and gate electrode for a MOS (Metal Oxide Semiconductor) transistor.

19. The method of claim 18 further comprising forming field oxide regions in said substrate to separate said MOS transistor from said buried contact.

20. The method of claim 14 wherein said diffusion region is formed by ion implanting a dopant of said second conductivity type in said substrate, through said second opening.

21. The method of claim 20 wherein said ion implanting a dopant of said second conductivity type is also used to form active regions of said MOS transistor.

* * * * *